(12) United States Patent
Kato (10) Patent No.: US 9,583,544 B2
(45) Date of Patent: Feb. 28, 2017

(54) ORGANIC EL DISPLAY DEVICE (71) Applicant: Japan Display Inc., Tokyo (JP)

(72) Inventor: Daisuke Kato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/818,555

(22) Filed: Aug. 5, 2015

(65) Prior Publication Data
US 2016/0043151 A1 Feb. 11, 2016

(30) Foreign Application Priority Data

Aug. 8, 2014 (JP) ................................. 2014-162537

(51) Int. Cl.
*H01L 27/32* (2006.01)
*H01L 51/52* (2006.01)

(52) U.S. Cl.
CPC ...... *H01L 27/3246* (2013.01); *H01L 51/5253* (2013.01)

(58) Field of Classification Search
CPC .................................................. H01L 27/3258
See application file for complete search history.

(56) References Cited

U.S. PATENT DOCUMENTS

| 2004/0099882 | A1* | 5/2004 | Hokari | H01L 51/0007 257/200 |
| 2009/0309486 | A1 | 12/2009 | Imai et al. | |
| 2010/0295759 | A1 | 11/2010 | Tanaka | |
| 2012/0280614 | A1 | 11/2012 | Imai et al. | |
| 2013/0161680 | A1* | 6/2013 | Oh | H01L 51/5256 257/99 |

FOREIGN PATENT DOCUMENTS

| JP | 2007-184251 A | 7/2007 |
| JP | 2007-250370 A | 9/2007 |
| JP | 4303591 B2 | 7/2009 |
| JP | 2010-272270 A | 12/2010 |
| WO | 03/028903 A2 | 4/2003 |

* cited by examiner

*Primary Examiner* — Lex Malsawma
(74) *Attorney, Agent, or Firm* — Typha IP LLC (57) ABSTRACT

A bank partitions a plurality of pixels and has an opening in each of the plurality of pixels. An organic layer includes a light emitting layer, and covers the bank opening. A first inorganic barrier layer is formed of an inorganic material, and covers the bank and the organic layer. A plurality of organic barrier portions are formed of organic materials, and are disposed on the first inorganic barrier layer. A second inorganic barrier layer is formed of the inorganic material, and covers the first inorganic barrier layer and the plurality of organic barrier portions. A recessed portion is formed on the bank and the first inorganic barrier layer (for example, the recessed portion is formed in an area which covers a contact hole), and a portion of the organic barrier portion is formed in the recessed portion.

7 Claims, 5 Drawing Sheets

ORGANIC EL DISPLAY DEVICE

CROSS-REFERENCE TO RELATED APPLICATION

The present application claims priority from Japanese application JP2014-162537 filed on Aug. 8, 2014, the content of which is hereby incorporated by reference into this application.

BACKGROUND OF THE INVENTION

1. Field of the Invention

The present invention relates to an organic EL display device.

2. Description of the Related Art

An organic electro luminescence (EL) display device includes a lower electrode disposed in each pixel and a bank disposed on an outer periphery of the lower electrode and partitions pixels adjacent to each other. In addition, the organic EL display device includes an organic layer including a light emitting layer. The organic layer covers the bank and the lower electrode. The bank includes a bank opening in each of the pixels, and the organic layer is in contact with the lower electrode inside the bank opening. In addition, generally, the organic layer is likely to be deteriorated due to moisture infiltration to the organic layer. For this reason, in the related art, a barrier structure which covers the organic layer has been proposed. JP2007-184251A, Japanese Patent No. 4303591, and JP2010-272270A disclose a barrier structure formed of a plurality of layers.

SUMMARY OF THE INVENTION

A pin hole may be caused in a barrier structure due to foreign particles such as dust in some cases. When the pin hole is caused, moisture infiltrates into the pin hole, and thereby an organic layer is deteriorated.

The inventors of the present application have examined the barrier structure including a plurality of barrier layers which are formed of inorganic materials, and an organic material. In the examined barrier structure, a first barrier layer covers the organic layer including a light emitting layer. The organic material is dispersed on the first barrier layer (a portion in which the organic material is formed is referred to as an "organic portion"). When a foreign particle exists on the first barrier layer, the organic portion is formed so as to surround the foreign particle. A second barrier layer covers the first barrier layer and the organic portion. According to this structure, an uneven surface (that is, a difference in level) around the foreign particle is decreased by the organic portion. Therefore, even a second barrier layer with a small thickness can completely cover the foreign particle. That is, even when the thickness of the second barrier layer is made small, the second barrier layer is not ruptured around the foreign particle. As a result, it is possible to efficiently prevent moisture from infiltrating into the organic layer. The organic portion forming the barrier structure is formed as follows. A solvent including the organic material is sprayed on the first barrier layer. The sprayed solvent coheres around the foreign particle due to surface tension of the solvent. Then, the cohered solvent is solidified to become the organic portion.

However, in a process of forming the organic portion, the organic portions are formed around not only the foreign particle, but also an circumference of the bank opening (the circumference means a corner between a side surface of the bank and an upper surface of the lower electrode. In other words, the circumference means an area closer to the edge of the bank opening). A refractive index of the organic portion and a refractive index of the barrier layer are different from one another. Due to this, the organic portions result to form a multiple interference film, and color of a light beam emitted from a center portion of the bank opening is different from that of a light beam emitted from the circumference.

The present invention has been made in view of the relevant problem, and an object of the present invention is to provide an organic EL display device which is capable of reducing an amount of organic materials stored in the circumference of the bank opening when forming a barrier structure which includes the organic material.

(1) According to an aspect of the present invention, there is provided an organic EL display device including: a bank partitioning a plurality of pixels, and having an opening formed in each of the plurality of pixels; an organic layer including a light emitting layer, and including a portion formed inside the opening of the bank; a first barrier layer formed of an inorganic material, and covering the bank and the organic layer; a plurality of organic portions formed of organic materials, and disposed on the first barrier layer; and a second barrier layer formed of an inorganic material, and covering the first barrier layer and the plurality of organic portions. A recessed portion is formed on the bank and the first barrier layer. A portion of the plurality of organic portions is formed in the recessed portion.

(2) The organic EL display device according to (1) may further include a TFT provided in each of the plurality of pixels; a planarization film covering the TFT; and a lower electrode provided in each of the plurality of pixels, formed on the planarization film, and connected to the TFT via a contact hole formed on the planarization film. The bank covers the contact hole, and the recessed portion on the bank and the first barrier layer is a portion which is recessed due to the contact hole.

(3) In the organic EL display device according to (2), a thickness of the bank is smaller than a thickness of the planarization film.

(4) In the organic EL display device according to (1), each of the plurality of pixels has, in the bank and the first barrier layer, the recessed portion in which the organic portion is disposed.

(5) In the organic EL display device according to (1), an area in which the organic portion does not exist is formed between the first barrier layer and the second barrier layer.

DETAILED DESCRIPTION OF THE INVENTION

Hereinafter, an embodiment of the present invention will be described with reference to the drawings. Note that, disclosure in the present specification is merely one example. A modification which maintains the spirit of the invention and is suitably made by those skilled in the art is surely contained in the scope of the invention. In addition, in order to make the description of the drawings more clear, a width, a thickness, and a shape of each portion in the present embodiment may be schematically represented as compared with the actual embodiment in some cases. The description of the drawings is merely an example, and does not limit the interpretation of the invention.

Figure 1:
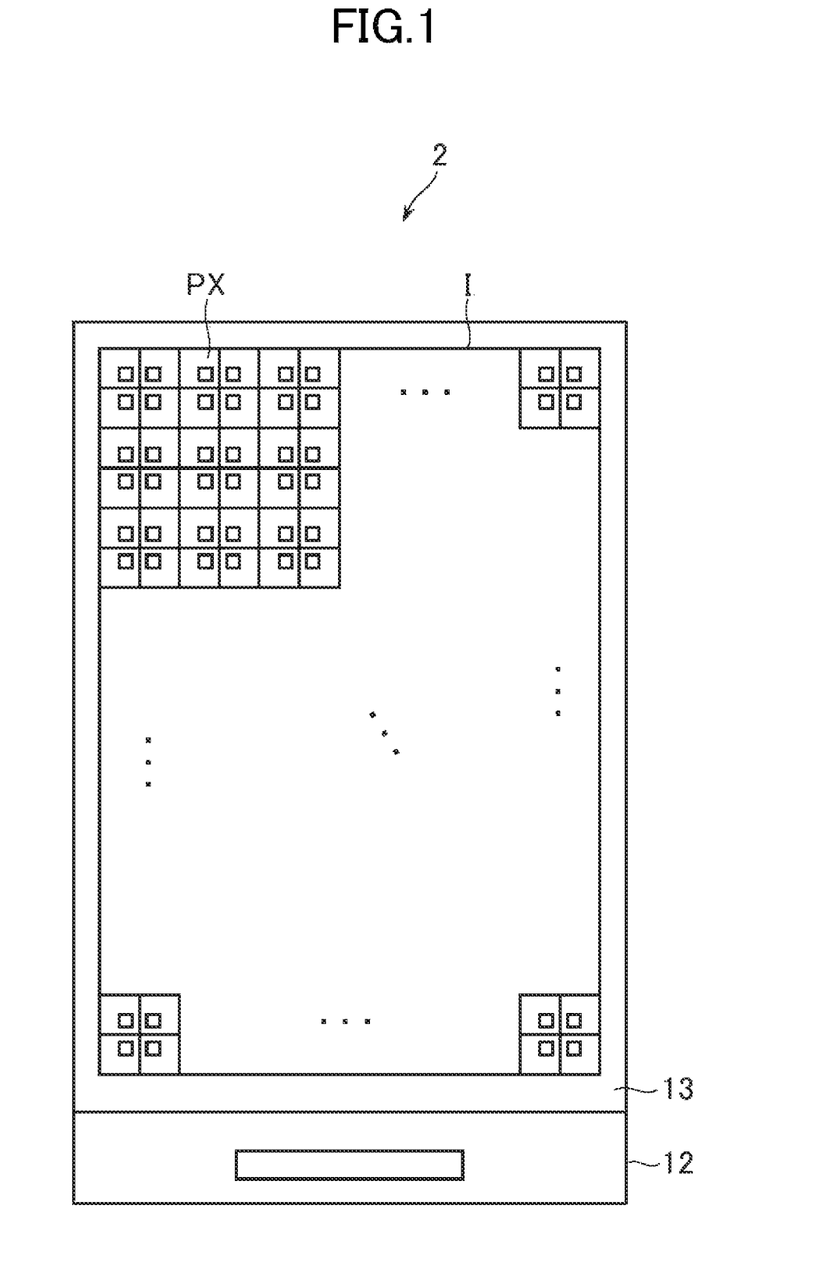
FIG. 1 is a plane view schematically illustrating an organic EL display device according to the present invention.

FIG. 1 is a plane view schematically illustrating an organic electro luminescence (EL) display device 2 according to the invention. The organic EL display device 2 includes a thin film transistor (TFT) substrate 12, and a counter substrate 13 facing the TFT substrate 12. A filler 30 (refer to FIG. 4) is filled between these substrates. The organic EL display device 2 has a plurality of pixels PX which are arrayed in a display area I in a horizontal direction and a vertical direction.

Figure 2:
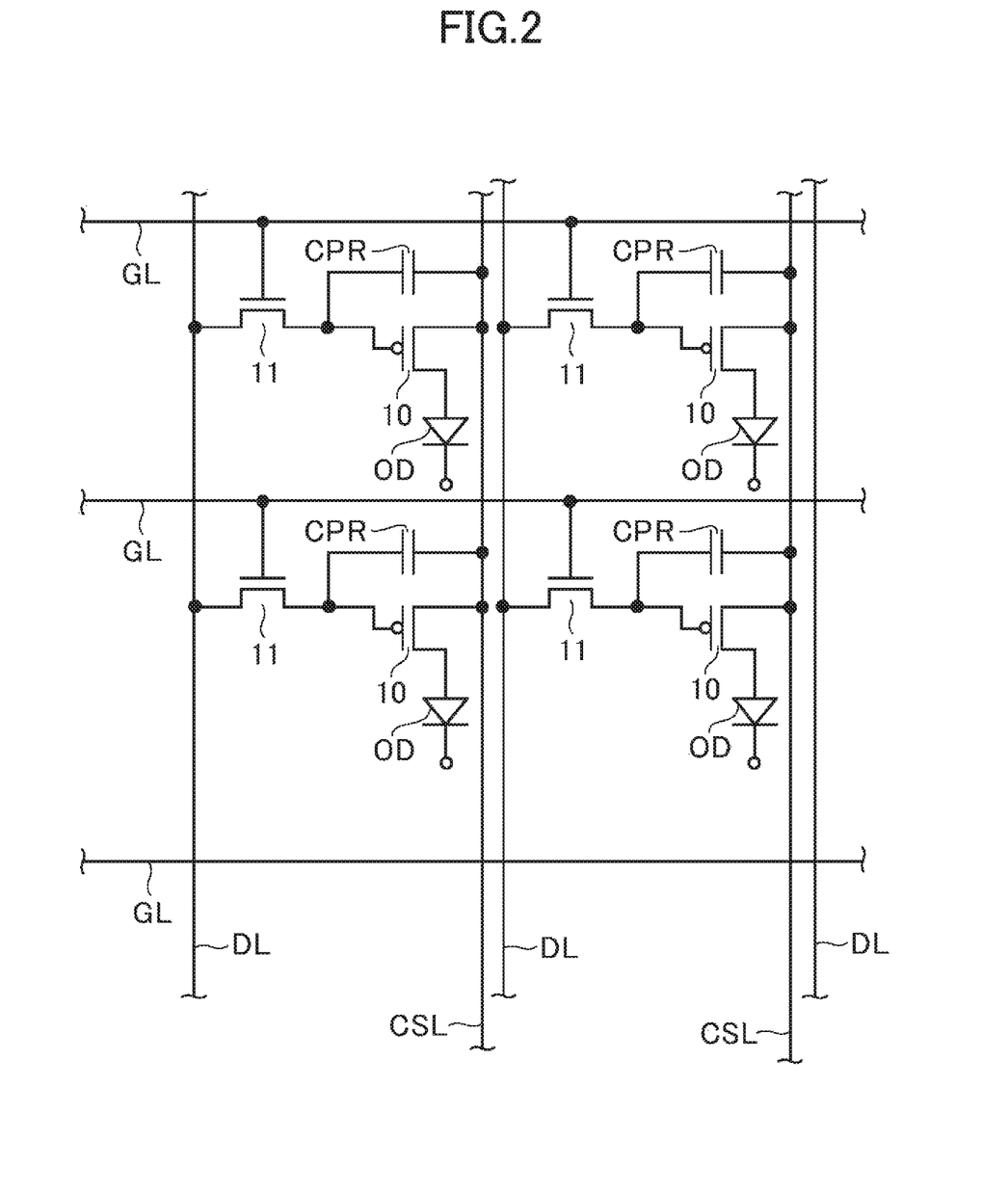
FIG. 2 is a circuit diagram illustrating an example of a circuit which is formed on a TFT substrate.

FIG. 2 is a circuit diagram illustrating an example of a circuit formed on the TFT substrate 12. A plurality of scanning signal lines GL extending in the horizontal direction, a plurality of video signal lines DL extending in the vertical direction are formed on the TFT substrate 12. An area which is surrounded by two scanning signal lines GL adjacent to each other and two video signal lines DL adjacent to each other is one pixel PX. Power supply lines CSL are formed on the TFT substrate 12. As described below, an organic layer 18 including a light emitting layer, a driving TFT element 10 for controlling the electric charge supply to the organic layer 18, or the like is formed on the TFT substrate 12 (refer to FIG. 4). As illustrated in FIG. 2, the driving TFT element 10, a storage capacitor CPR, and a switching TFT 11 are formed in each of the pixels PX. In addition, an organic light-emitting diode OD is formed in each of the pixels PX. The organic light-emitting diode OD is formed of the organic layer 18, and a lower electrode 4 (for example, an anode electrode) and an upper electrode 20 (for example, a cathode electrode) (refer to FIG. 4). The switching TFT 11 is turned on by applying a gate voltage to the scanning signal line GL. At this time, a video signal is supplied from the video signal line DL, and then electric charges are accumulated in the storage capacitor CPR. In addition, the driving TFT element 10 is turned on by accumulating the electric charges in the storage capacitor CPR, and electric current flows from the power supply lie CSL to the organic light-emitting diode OD, thereby emitting the organic light-emitting diode OD.

Figure 3:
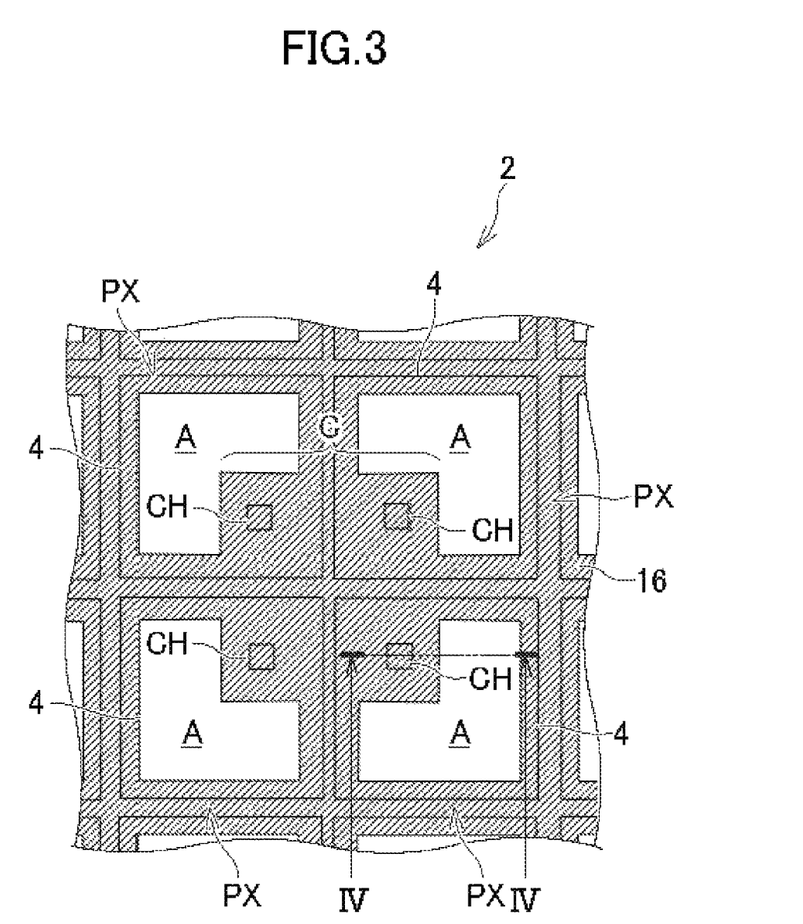
FIG. 3 is a plane view of the organic EL display device according to the invention.
Figure 4:
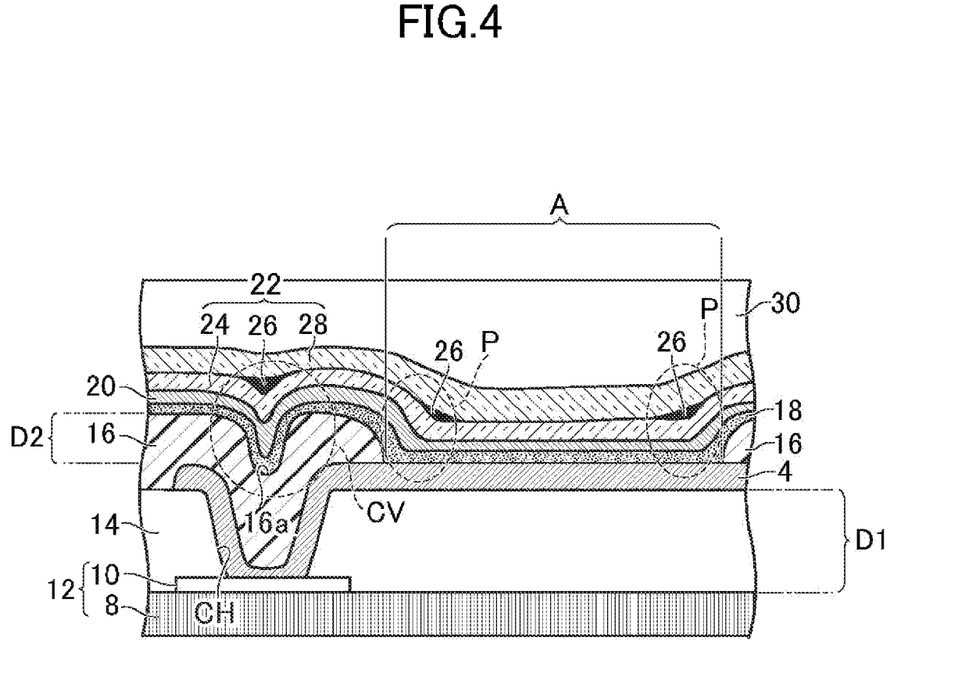
FIG. 4 is a sectional view taken along line IV-IV shown in FIG. 3.

The plurality of pixels PX form one pixel unit. FIG. 3 is a plane view of the TFT substrate 12 illustrating one pixel unit. FIG. 4 is a sectional view of the organic EL display device 2 taken along line IV-IV shown in FIG. 3. For example, as illustrated in FIG. 3, four pixels form one pixel unit. The four pixels PX include, for example, a red pixel PX, a green pixel PX, a blue pixel PX, and a white pixel PX. The four pixels PX are disposed, for example, in two columns and two rows. The disposition of the pixels PX which form the pixel unit is not limited to that as illustrated in FIG. 3. For example, the four pixels PX forming one pixel unit may be arrayed in one direction (for example, in the horizontal direction). In addition, the number of pixels PX forming one pixel unit is not limited to four as illustrated in FIG. 3. For example, one pixel unit may be formed of three pixels PX (for example, the red pixel PX, the green pixel PX, and the blue pixel PX). The display device 2 may be a color filter type or a separate coloring type. That is, the organic layer 18 as described below is formed in the entire display area so as to emit white light, and a color filter corresponding to a color of each of the pixels may be formed on the counter substrate 13 (the color filter type). The organic layer 18 may be separated for each pixel so as to emit light with the color of each pixel (the separate coloring type).

As illustrated in FIG. 4, the lower electrode 4 is formed on the TFT substrate 12. The lower electrode 4 is formed in each of the pixels PX. The TFT substrate 12 is provided with a bank 16 partitioning the plurality of pixels PX. In FIG. 3, an area of the bank 16 is hatched. As illustrated in FIG. 4, the bank 16 surrounds the outer periphery of each lower electrode 4 and overlaps a peripheral edge of the lower electrode 4. The bank 16 has a bank opening A in each of the pixels PX, and the lower electrode 4 is exposed to the bank opening A. In addition, a plurality of contact holes CH are formed on the TFT substrate 12. The contact hole CH is covered with the bank 16. In an example illustrated in FIG. 3, the lower electrode 4 is formed into a rectangular shape, and the contact hole CH is formed in each of the pixels PX.

As illustrated in FIG. 4, the TFT substrate 12 includes a planarization film 14 on a layer below the lower electrode 4. The TFT substrate 12 includes a substrate 8, and a circuit layer including the driving TFT element 10 is formed on an upper surface of the substrate 8. The driving TFT element 10 is a switching element for controlling the electric current which flows into the lower electrode 4 (in FIG. 4, a detained structure of the driving TFT element 10 is omitted). The planarization film 14 covers the circuit layer. In addition, the planarization film 14 in each of the pixels includes the aforementioned contact hole CH (a through hole passing through the planarization film 14). The lower electrode 4 is connected to the driving TFT element 10 via the contact hole CH. A reference symbol D1 indicates the film thickness of the planarization film 14.

As described above, the TFT substrate 12 is formed of an insulator, and has the bank 16 formed on the lower electrode 4. The bank opening A is formed on the bank 16. For example, as illustrated in FIG. 3, the bank opening A is formed into an L-shape in a planar view. In a forming process of the bank 16, first, a layer of the insulator (a material of the bank 16) is formed on the lower electrode 4. Thereafter, a portion corresponding to the bank opening A is removed from the formed layer. In this way, the bank 16 is formed. As illustrated in FIG. 4, the bank 16 includes an area CV covering the contact hole CH. For example, as illustrated in FIG. 3, the four pixels PX which form one pixel unit are formed in such a manner that the areas CV of the four pixels PX are connected to each other at a center portion C in the one pixel unit. That is, the bank openings A of the four pixels PX are disposed so as to surround the center portion C of the four pixels PX. The position or shape of the bank opening A is not limited to that as illustrated in FIG. 3.

The bank 16 includes a recessed portion 16a which is recessed due to the contact hole CH in the area CV covering the contact hole CH. In the present embodiment, a film thickness D2 of the bank 16 (a distance between the lower electrode 4 and the upper surface of the bank 16) is small. For example, it is preferable that the film thickness D2 of the bank 16 is smaller than the film thickness D1 of the planarization film 14. Therefore, the undulation (the recessed portion 16a) corresponding to cross-sectional shapes of the planarization film 14 and the lower electrode 4 is easily formed in the bank 16. The film thickness D2 of the bank 16 may be smaller than half of the film thickness D1 of the planarization film 14. The recessed portion 16a of the bank 16 formed in the area CV is made due to the undulation of the planarization film 14 and the lower electrode 4 in a process where the bank 16 is formed on the lower electrode 4.

The TFT substrate 12 includes an element of the organic light-emitting diode OD as illustrated in FIG. 2 in addition to the lower electrode 4. That is, the TFT substrate 12 has the organic layer 18 including a light emitting layer which emits light due to the phenomenon of organic electroluminescence, and the upper electrode 20. When a voltage is applied to the lower electrode 4 and the upper electrode 20 through the driving TFT element 10, holes and electrons are injected into each of the organic layer 18 from the lower electrode 4 and the upper electrode 20, and the injected holes and electrons are coupled in the light emitting layer to emit light. The bank 16 prevents a short circuit from being generated between the lower electrode 4 and the upper electrode 20.

The organic layer 18 includes a portion formed inside the bank opening A. In an example illustrated in FIG. 4, the organic layer 18 is consecutively formed on an end portion of the bank 16 and the lower electrode 4. The upper electrode 20 is consecutively formed on, and covers the bank 16 and the organic layer 18. The upper electrode 20 includes a recessed portion which is recessed due to the contact hole CH in the area CV covering the contact hole CH. In addition, the upper electrode 20 has an uneven portion which is swollen in response to the shape of the bank 16 in an circumference P (an edge portion of the bank opening A) of the bank opening A. In the process of forming the organic layer 18 and the upper electrode 20, the recessed portion and the uneven portion are generated on the organic layer 18 and the upper electrode 20 in response to undulations of the cross-sectional shape of the lower electrode 4 and the bank 16 (that is, convexo-concave of the lower electrode 4 and the bank 16).

The organic layer 18 and the upper electrode 20 are covered with a barrier layer 22. That is, the barrier layer 22 is consecutively formed on the upper electrode 20 (to cover the upper electrode 20). The barrier layer 22 protects the organic light-emitting diode (particularly, the organic layer 18) from moisture.

The counter substrate 13 (refer to FIG. 1) is disposed above the barrier layer 22. The filler 30 is filled between the barrier layer 22 and the counter substrate 13.

Figure 5:
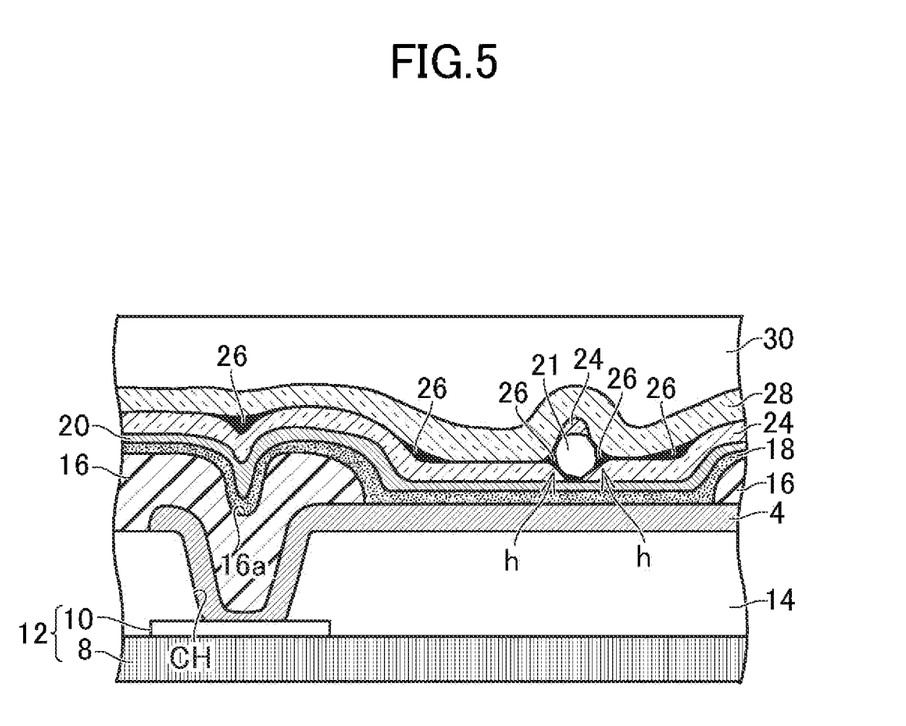
FIG. 5 is a diagram illustrating a state where foreign particle is mixed.

As illustrated in FIG. 4, the barrier layer 22 has a multi-layer structure in which a plurality of organic barrier portions 26 are sandwiched between a first inorganic barrier layer 24 and a second inorganic barrier layer 28. The first inorganic barrier layer 24 is provided to protect the organic layer 18 from moisture. The first inorganic barrier layer 24 is consecutively formed on the upper electrode 20 as illustrated in FIG. 4, and covers the bank 16 and the organic layer 18. The first inorganic barrier layer 24 is formed of an inorganic material which prevents moisture from infiltrating. The inorganic material is, for example, SiN, but is not limited to SiN. The first inorganic barrier layer 24 may be formed of one or a plurality of layers. For example, the first inorganic barrier layer 24 may include a SiN layer and a SiO layer. In this case, the SiO layer may constitute an upper layer of the first inorganic barrier layer 24, and may be in contact with the organic barrier portions 26 and the second inorganic barrier layer 28. With this configuration, it is possible to improve adhesive properties between the organic barrier portions 26 and the first inorganic barrier layer 24. The first inorganic barrier layer 24 has a recessed portion which is recessed due to the contact hole CH in the area CV. In addition, the first inorganic barrier layer 24 has an uneven portion which is swollen in response to the shape of the bank 16 in the circumference P. The first inorganic barrier layer 24 can be formed on the upper electrode 20 by using, for example, a plasma CVD method. The recessed portion and the uneven portions of the first inorganic barrier layer 24 are formed in response to undulations of the shape of the upper electrode 20 in the process of forming the first inorganic barrier layer 24. A pin hole h is formed on the first inorganic barrier layer 24 because of foreign particle 21. FIG. 5 is a diagram illustrating a state where the foreign particle 21 is mixed in the first inorganic barrier layer 24. As illustrated in FIG. 5, the pin hole h is formed on the bottom of the foreign particle 21. This pin hole h causes moisture infiltration from the outside.

The plurality of organic barrier portions 26 are disposed on the first inorganic barrier layer 24. It is possible to fill the pin hole h with the plurality of organic barrier portions 26. These organic barrier portions 26 are formed of organic materials (for example, an acrylic resin, a polyimide resin, and an epoxy resin), and dispersed on the first inorganic barrier layer 24. That is, as illustrated in FIG. 4 and FIG. 5, the organic barrier portion 26 is formed in the recessed portion (that is, the area CV) and the uneven portion (that is, the circumference P in the bank opening A) which are formed on the first inorganic barrier layer 24. When the foreign particle 21 is mixed in the first inorganic barrier layer 24, the organic barrier portion 26 surrounds the foreign particle 21 as illustrated in FIG. 5, and thus, the pin hole h is filled with the organic barrier portion 26.

These organic barrier portions 26 are formed by spraying a solvent which is obtained by mixing the organic material and a polymerization initiator to the first inorganic barrier layer 24 under the vacuum condition. Specifically, the solvent is intermittently sprayed by a certain amount. At this time, the supplying conditions of the solvent (a supplying time, the temperature of a substrate, the atmosphere for forming a film, or the like) are adjusted so that the organic material does not form a film which is consecutively formed on the first inorganic barrier layer 24. The attached organic materials exhibit behavior as a liquid, and thus easily cohere by its surface tension in a spot that is not flattened, and do not easily cohere in a flat place. For this reason, the organic materials are stored in the recessed portion, the uneven portion (that is, the circumference P), and the pin hole h formed on the first inorganic barrier layer 24. The organic materials are not easily stored in other places. Accordingly, the plurality of organic barrier portions 26 are dispersed on the first inorganic barrier layer 24.

When the foreign particle 21 is mixed, the second inorganic barrier layer 28 is formed so as to completely cover the foreign particle 21. Similar to the first inorganic barrier layer 24, the second inorganic barrier layer 28 is formed of an inorganic material which prevents moisture from infiltrating. The inorganic material is, for example, SiN, but is not limited to SiN, similar to the material of the first inorganic barrier layer 24. The second inorganic barrier layer 28 may be formed of one or a plurality of layers similar to the first inorganic barrier layer 24. The second inorganic barrier layer 28 is consecutively formed on, and covers the first inorganic barrier layer 24 and the plurality of organic barrier portions 26, as illustrated in FIG. 4 and FIG. 5. The second inorganic barrier layer 28 is formed, for example, by using the plasma CVD method. The foreign particle 21 is surrounded by the organic barrier portion 26 which is filled in the pin hole h. For this reason, the second inorganic barrier layer 28 is not ruptured due to the foreign particle 21, but can completely cover the foreign particle 21. Accordingly, even when the foreign particle 21 is mixed as illustrated in FIG. 5, the barrier layer 22 can protect the organic light-emitting diode OD from moisture by employing this multi-layer structure.

The organic barrier portion 26 formed in the uneven portion (that is, the circumference P) in the first inorganic barrier layer 24 results to make a multiple interference film due to the difference of an optical refractive index between the organic barrier portion 26 and the inorganic barrier layers 24 and 28, and thus has an effect on the light emission from the pixel. In addition, an amount of the organic barrier portion 26 in a pixel sensitively depends on the unevenness of the circumference P in the bank opening A. Since the unevenness of each of the pixels is not exactly the same as one another, optical properties of the pixels vary according to the unevenness. Accordingly, it is preferable to lessen the amount of the organic material stored in the uneven portion to thereby reduce the size of the organic barrier portions 26 formed in the uneven portion.

In the organic EL display device 2, the recessed portion is formed on the first inorganic barrier layer 24 due to the recessed portion 16a formed in the bank 16. For example, in the example illustrated in FIG. 4, in the area CV, the recessed portion is formed on the first inorganic barrier layer 24 due to the recessed portion 16a of the bank 16 which is formed in the area CV and covers the contact hole CH. Accordingly, in the process of forming the organic barrier portion 26, the organic material is stored not only in the circumference P (that is, the uneven portion in the first inorganic barrier layer 24) in the bank opening A, but also the recessed portion 16a. Therefore, it is possible to lessen the amount of the organic material stored in the circumference P in the bank opening A to thereby reduce the size of the organic barrier portions 26 formed in the circumference P.

As described above, the recessed portion in the area CV which is formed on the bank 16, the organic layer 18, and the first inorganic barrier layer 24 is formed by using the contact hole CH. Thus, a process (for example, an etching process) of forming the recessed portion may not be additionally performed. A relationship between the thickness of the planarization film 14 and the thickness of each of the bank 16, the organic layer 18, and the first inorganic barrier layer 24 is designed so that the recessed portion in the first inorganic barrier layer 24 is made due to the contact hole CH of the planarization film 14. For example, the film thickness D2 of the bank 16 is smaller than the film thickness D1 of the planarization film 14. Thus, the size of the recessed portion of the bank 16 becomes larger.

The organic EL display device 2 is manufactured as follows. The circuit layer including the driving TFT element 10 is formed on the upper surface of the substrate 8. Then, the planarization film 14 for covering the circuit layer is formed on the substrate 8. In addition, the contact hole (the through hole) CH is formed on the planarization film 14. The contact hole can be formed through a photolithography process. The lower electrode 4 is formed above the planarization film 14. The lower electrode 4 is formed in each of the pixels. The bank 16 is formed above the lower electrode 4. The bank 16 is patterned so as to include the opening A in each of the pixels. The recessed portion 16a is formed in the bank 16. The recessed portion 16a is formed due to the contact hole CH. The organic layer 18 including the light emitting layer is formed on the bank 16 and the lower electrode 4. The organic layer 18 includes a portion formed inside the bank opening A and comes in contact the lower electrode 4. The organic layer 18 may be formed by vacuum deposition method or may be formed by printing method. The upper electrode 20 is formed on the organic layer 18 so as to cover the organic layer 18. Then, the first inorganic barrier layer 24 for covering the bank 16, the organic layer 18, and the upper electrode 20 is formed of the inorganic material. As described above, the first inorganic barrier layer 24 can be formed on the upper electrode 20 by, for example, the plasma CVD method. The thickness of each of the organic layer 18, the upper electrode 20, and the first inorganic barrier layer 24 is smaller than that of the bank 16, and thus the recessed portion due to the recessed portion 16a of the bank 16 is formed on the first inorganic barrier layer 24 as well. Thereafter, as described above, the organic material is sprayed on the first inorganic barrier layer 24, and the plurality of organic barrier portions 26 formed of the organic material are formed on the first inorganic barrier layer 24. At this time, a portion of the organic barrier portion 26 is formed at a position due to the recessed portion 16a of the bank 16. In addition, a portion of the organic barrier portion 26 is formed in the circumference in the bank opening A as well. Thereafter, the second inorganic barrier layer 28 which covers the first inorganic barrier layer 24 and the plurality of organic barrier portions 26 is formed of the inorganic material. The organic EL display device 2 is obtained by applying the filler 30 on the second inorganic barrier layer 28, and bonding the counter substrate 13 to the TFT substrate 12.

In the organic EL display device 2, the organic barrier portion 26 is also formed at a position due to the recessed portion 16a. For this reason, it is possible to reduce the amount of the organic barrier portion 26 stored in the circumference P while forming the sufficient amount of the organic barrier portion 26 so as to surround the foreign particle 21. As a result, it is possible to reduce the variation of optical properties among the pixels while maintaining moisture blocking properties for the organic layer 18.

The present invention is not limited to the above embodiment, and various modifications are possible. For example, the configuration described in the above embodiment may be replaced with substantially the same configuration, a configuration which exhibits the same effects, or a configuration which achieves the same object.

For example, the first inorganic barrier layer 24 may have a layered structure constituted by the inorganic material (for example, SiN) layer and the SiO layer thereon. With the SiO layer, it is possible to prompt the cohesion of the organic material due to the surface tension.

In addition, for example, the film thickness D2 of the bank 16 may be greater than the film thickness D1. In addition, for example, the recessed portion 16a may be formed in the bank 16 through etching. For example, when the film thickness D2 of the bank 16 is large, and thus the recessed portion 16a is not easily formed in the area CV, the recessed portion 16a may be formed in the bank 16 through the etching. In addition, when the recessed portion 16a is formed in the bank 16 through the etching, the recessed portion 16a may be formed over the entirety of the plurality of pixels PX (for example, over the plurality of pixels PX forming one pixel unit).

Further, the recessed portion 16a which is formed in the bank 16 may be formed anywhere without being limited to the area CV which covers the contact hole CH.

What is claimed is:
1. An organic EL display device comprising:
a bank partitioning a plurality of pixels, and having an opening formed in each of the plurality of pixels;
an organic layer including a light emitting layer, and including a portion formed inside the opening of the bank;

a first barrier layer formed of an inorganic material, and covering the bank and the organic layer;

a plurality of organic portions formed of organic materials, and disposed on the first barrier layer;

a second barrier layer formed of an inorganic material, and covering the first barrier layer and the plurality of organic portions, a TFT provided in each of the plurality of pixels;

a planarization film covering the TFT; and a lower electrode provided in each of the plurality of pixels, formed on the planarization film, and connected to the TFT via a contact hole formed on the planarization film, wherein a recessed portion is formed on the bank and the first barrier layer, a portion of the plurality of organic portions is formed in the recessed portion, the bank covers the contact hole, and the recessed portion on the bank and the first barrier layer is a portion which is recessed due to the contact hole.

2. The organic EL display device according to claim 1, wherein a thickness of the bank is smaller than a thickness of the planarization film.

3. The organic EL display device according to claim 1, wherein each of the plurality of pixels has, in the bank and the first barrier layer, the recessed portion in which the organic portion is disposed.

4. The organic EL display device according to claims 1, wherein an area in which the organic portion does not exist is formed between the first barrier layer and the second barrier layer.

5. An organic EL display device comprising:

a bank partitioning a plurality of pixels, and having an opening formed in each of the plurality of pixels;

an organic layer including a light emitting layer, and including a portion formed inside the opening of the bank;

a first barrier layer formed of an inorganic material, and covering the bank and the organic layer;

a plurality of organic portions formed of organic materials, and disposed on the first barrier layer; and a second barrier layer formed of an inorganic material, and covering the first barrier layer and the plurality of organic portions, wherein a recessed portion is formed on the bank and the first barrier layer, a portion of the plurality of organic portions is formed in the recessed portion, and each of the plurality of pixels has, in the bank and the first barrier layer, the recessed portion in which the organic portion is disposed.

6. The organic EL display device according to claim 5, further comprising a planarization film covering a TFT provided in each of the plurality of pixels, wherein a thickness of the bank is smaller than a thickness of the planarization film.

7. The organic EL display device according to claims 5, wherein an area in which the organic portion does not exist is formed between the first barrier layer and the second barrier layer.

* * * * *